United States Patent
Ottini et al.

(10) Patent No.: US 6,346,905 B1
(45) Date of Patent: Feb. 12, 2002

(54) ANALOG-TO-DIGITAL FLASH CONVERTER FOR GENERATING A THERMOMETRIC DIGITAL CODE

(75) Inventors: Daniele Ottini, Pavia; Melchiorre Bruccoleri, Rho; Giacomino Bollati, Castel San Giovanni; Marco Demicheli, Binago, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/447,065

(22) Filed: Nov. 22, 1999

(30) Foreign Application Priority Data

Nov. 27, 1998 (EP) .............................. 98830712

(51) Int. Cl.[7] .......................... H03M 13/00; H03M 1/36
(52) U.S. Cl. .......................................... 341/159; 341/94
(58) Field of Search ................................ 341/141, 155, 341/156, 159, 160, 169, 94, 154; 708/700; 326/82, 86

(56) References Cited

U.S. PATENT DOCUMENTS

| 4,733,220 A | | 3/1988 | Knierim | |
| 5,029,305 A | | 7/1991 | Richardson | |
| 5,272,461 A | | 12/1993 | Zojer | |
| 5,291,198 A | * | 3/1994 | Dingwall et al. | 341/159 |
| 5,808,573 A | * | 9/1998 | Shih et al. | 341/110 |
| 6,222,476 B1 | * | 4/2001 | Lee et al. | 341/159 |
| 6,225,937 B1 | * | 5/2001 | Butler | 341/169 |

FOREIGN PATENT DOCUMENTS

EP        98830712.0       11/1998

* cited by examiner

*Primary Examiner*—Patrick Wamsley
(74) *Attorney, Agent, or Firm*—Lisa K. Jorgenson; Allen, Dyer, Doppelt, Milbrath & Gilchrist, P.A.

(57) ABSTRACT

A flash analog-to-digital converter includes a bank of comparators with a differential output, generating a thermometric code, and a bank of three-input logic NOR gates. The converter has enhanced immunity to noise and reduced imprecisions by providing for a passive interface including a plurality of voltage dividers each connected between the noninverted output of a respective comparator and the inverted output of the comparator of higher order of the bank. A corresponding logic NOR gate of the bank has a first input coupled to the inverted output of the respective comparator, a second input coupled to the noninverted output of the comparator of higher order and a third input coupled to an intermediate node of the voltage divider.

17 Claims, 3 Drawing Sheets

ANALOG-TO-DIGITAL FLASH CONVERTER FOR GENERATING A THERMOMETRIC DIGITAL CODE

FIELD OF THE INVENTION

The invention relates to signal processing systems, and, more particularly to an analog/digital converter capable of outputting a thermometric digital code.

BACKGROUND OF THE INVENTION

The ever expanding applications of digital signal processing in place of the traditionally analog processing, requires the conversion of analog signals into digital signals. Processing of high frequency signals requires analog/digital converters with adequately high speed characteristics. The speed and reliability requirements, in terms of statistical incidence of conversion imprecisions, of modern processing systems raise important technological and circuit design problems for overcoming critical functioning behavior of the converters which are often required to function at the limit of their stability characteristics, and wherein metastability phenomena may significantly affect the number of errors of conversion.

The phenomena of metastability in comparators used in an analog/digital converter may cause glitches on the output digital code (word). Glitches may affect correct data processing downstream of the of analog-digital converter. Since the number of errors is exponentially correlated to the clock frequency and to the regenerative time constant of the comparators, the metastability errors may increase in number by several orders of magnitude upon increasing the clock frequency and/or decreasing the supply voltage.

Many techniques have been proposed and developed to reduce the number of errors due to metastability phenomena of the comparators of an analog/digital converter, in order to ensure that the errors remain below a certain limit which, in some applications, may be fixed at a number below $10^{-10}$ errors/cycles. The enhancement of the performance of comparators employed in a converter is an approach that ceases to be effective when operating at the technological limits of integration and of minimization of the silicon requirement and/or of power consumption.

In view of these limits, the proposed techniques include introducing latch arrays in cascade (pipelining) of the comparators' outputs in order to increase the resolution time of the comparators. The pipelining technique, while being capable of decisively reducing the number of errors, increases the circuit complexity. In other words, the pipelining technique may increase the required silicon area and the current absorption. Moreover, this approach necessitates a strict correlation between the increment of the complexity of the pipelining circuits downstream of the array of comparators and their performance in terms of their ability of reducing the number of errors. The article: "Power-efficient metastability error reduction in CMOS flash A/D converters" by C. L. Portmann, T. H. Meng, IEEE Journal of solid state circuits, Vol. 31, No. 8, August 1996, offers a review of the different known techniques of this type.

Typically, modern high speed flash analog/digital converters (flash ADC) include an array of comparators for producing a thermometric code and an array of NOR gates for outputting only a single "1" among all "0s" to a NOR plane or circuit of a programmable logic array (PLA) are employed, as schematically shown in FIG. 1. As such, the above mentioned article purports the use of three-input NOR cells rather than two-input NOR cells so that the third input may be used as a common mode reference input, by selecting a value higher than the output common mode value of the comparators as a reference.

However, in flash ADCs using high speed bipolar devices, the output dynamic of the comparators may be of a few thermal potentials, thereby, the margin of noise reduction that may be obtained by implementing a common mode circuit, according to the technique suggested in the above cited article, is practically rather limited.

SUMMARY OF THE INVENTION

In order to improve immunity to noise and imprecision of the common mode circuit, an effective approach has now been found based on the use of a passive interface at the output of the array of comparators. In practice, this approach realizes a logic that may be defined as pseudo-differential compared to the differential logic of the known circuits.

Specifically, the flash ADC of the invention comprises an array or bank of comparators having a differential output and generating a thermometric code, a bank of three-input logic NOR gates, and a passive interface constituted by voltage dividers. Each voltage divider is connected between the noninverted output of a respective comparator and the inverted output of the comparator of higher order. The respective NOR gate has a first input coupled to the inverted output of the respective comparator, a second input coupled to the noninverted output of the comparator of higher order and a third input coupled to a intermediate node of the voltage divider connected between the noninverted output of the respective comparator and the inverted output of the comparator of higher order.

The passive interface comprising the plurality of voltage dividers decisively increases the immunity to common mode disturbances and noise without sensibly increasing the area requirement or the power consumption.

BRIEF DESCRIPTION OF THE DRAWINGS

The various aspects and advantages of the invention will become even clearer through the following description of an embodiment and by referring to the attached drawings, wherein.

DETAILED DESCRIPTION OF THE PREFERRED EMBODIMENTS

Figure 1:
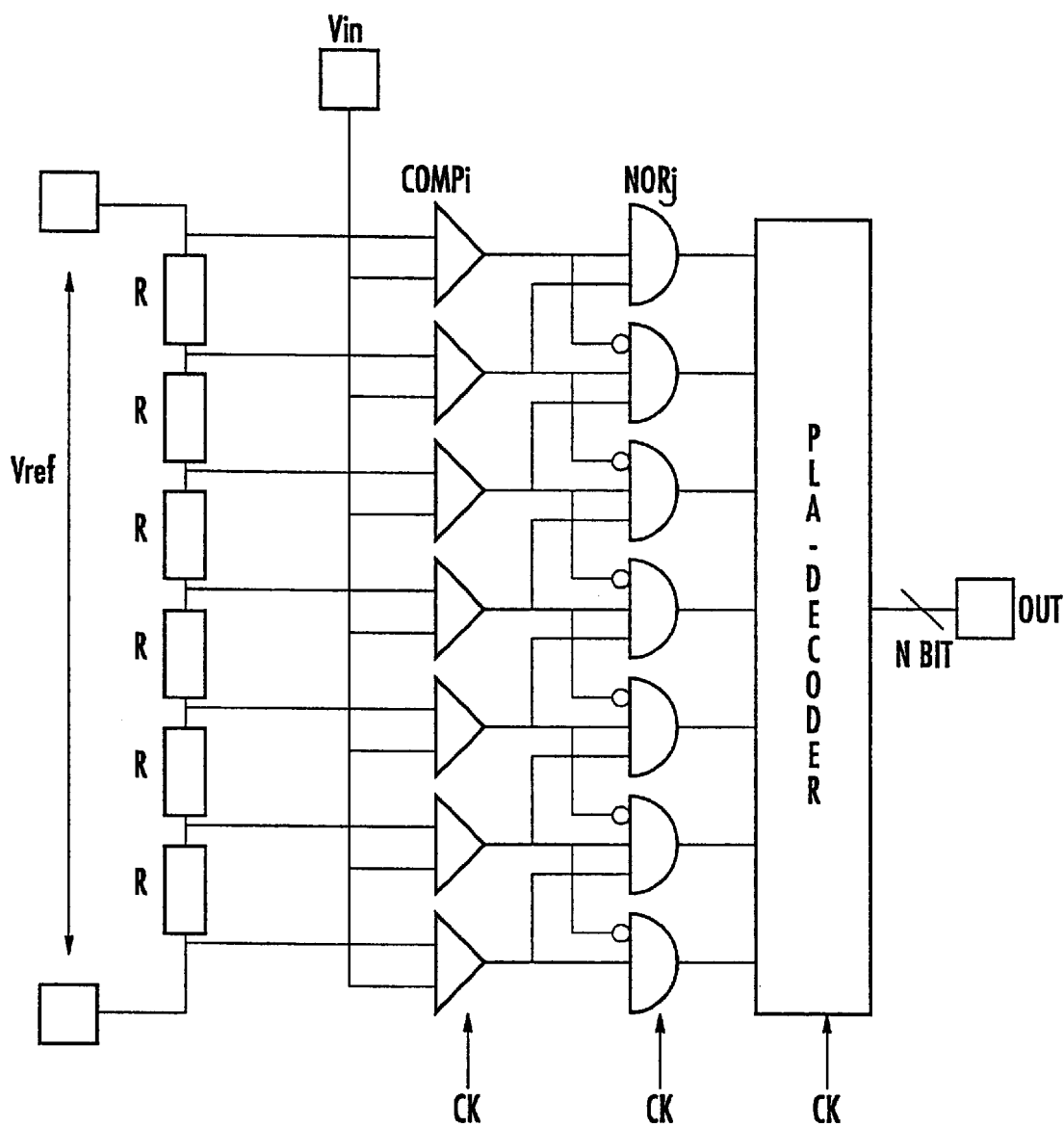
FIG. 1 shows a conventional functional scheme of a flash ADC according to the prior art.

FIG. 1 shows the conventional architecture of a flash ADC in which the bank of comparators COMPi supply a thermometric code and the bank of latches NORj outputs only a single "1" and all "0s" to the NOR plane of a PLA decoder which outputs an N bit word or digital datum corresponding to the sampled analog value Vin.

Figure 2:
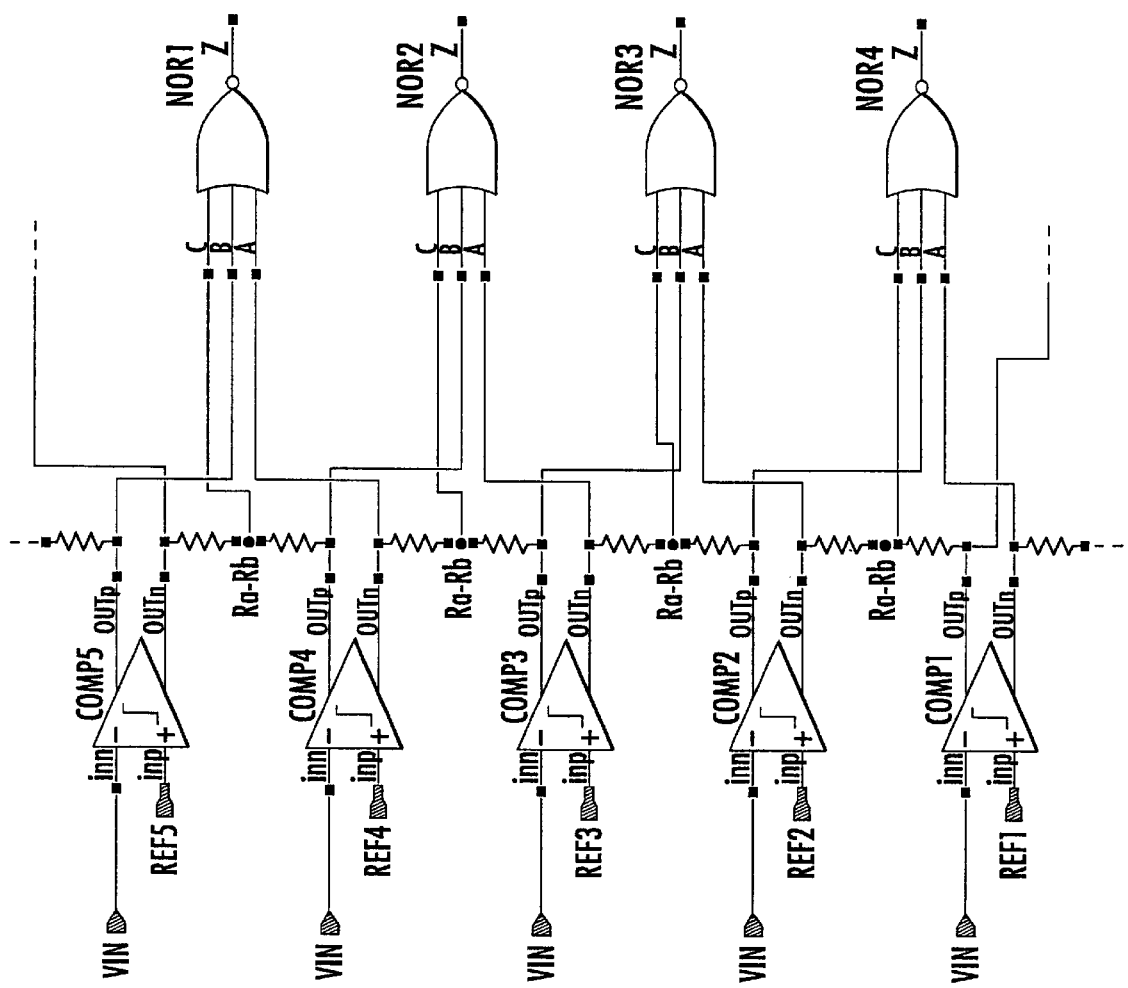
FIG. 2 is a partial scheme that illustrates the passive interface between the comparators outputs and the inputs of the NOR latches, according to the present invention.

FIG. 2 shows the detail of a flash ADC circuit according to the present invention. As can be seen in the figure, a voltage divider Ra-Rb is connected between the noninverted output out_p of a comparator and the inverted output out_n of the comparator of higher order of the bank. An intermediate node of the resistive voltage divider Ra-Rb is connected to the input C of the pipelining NOR gate latch of the first comparator output.

Assuming that two consecutive comparators of the bank of comparators of the converter output the same logic signal during a certain phase, the common mode input of the NOR gate coupled to the outputs of the two consecutive comparators may be considered ideally equal to the output common mode of the two comparators, in this case the two comparators are not metastable.

By contrast, if two consecutive comparators, for example the comparators COMP2 and COMP3 of the bank, are both considered to have an input signal of a level between their discriminating thresholds, should COMP3 be a metastable comparator, the input nodes of NOR3 will be at the following levels:

node A at a low logic level;

node B at an undetermined logic level, lower than the output common mode of the two comparators COMP2 and COMP3; and node C at a higher level than the output common mode of the comparators by an amount greater than half the positive dynamic of the two comparators.

Therefore, the logic level of the output of NOR3 will be high, as it should be.

In an analogous manner, the input nodes of NOR2 will be at the following levels:

node A at an undetermined logic value higher than the output common mode of the two comparators COMP2 and COMP3;

node B at a low logic value; and node C at an undetermined level, however, since NOR2 is adjacent to NOR3, the problem may be easily solved as described in the above cited article.

It is evident how the passive interface, realized by way of voltage dividers, introduced between the comparators outputs and the inputs of the NOR gates, increases the immunity to common mode disturbances and to noise without substantially increasing the area of integration and/or the power consumption.

Figure 3:
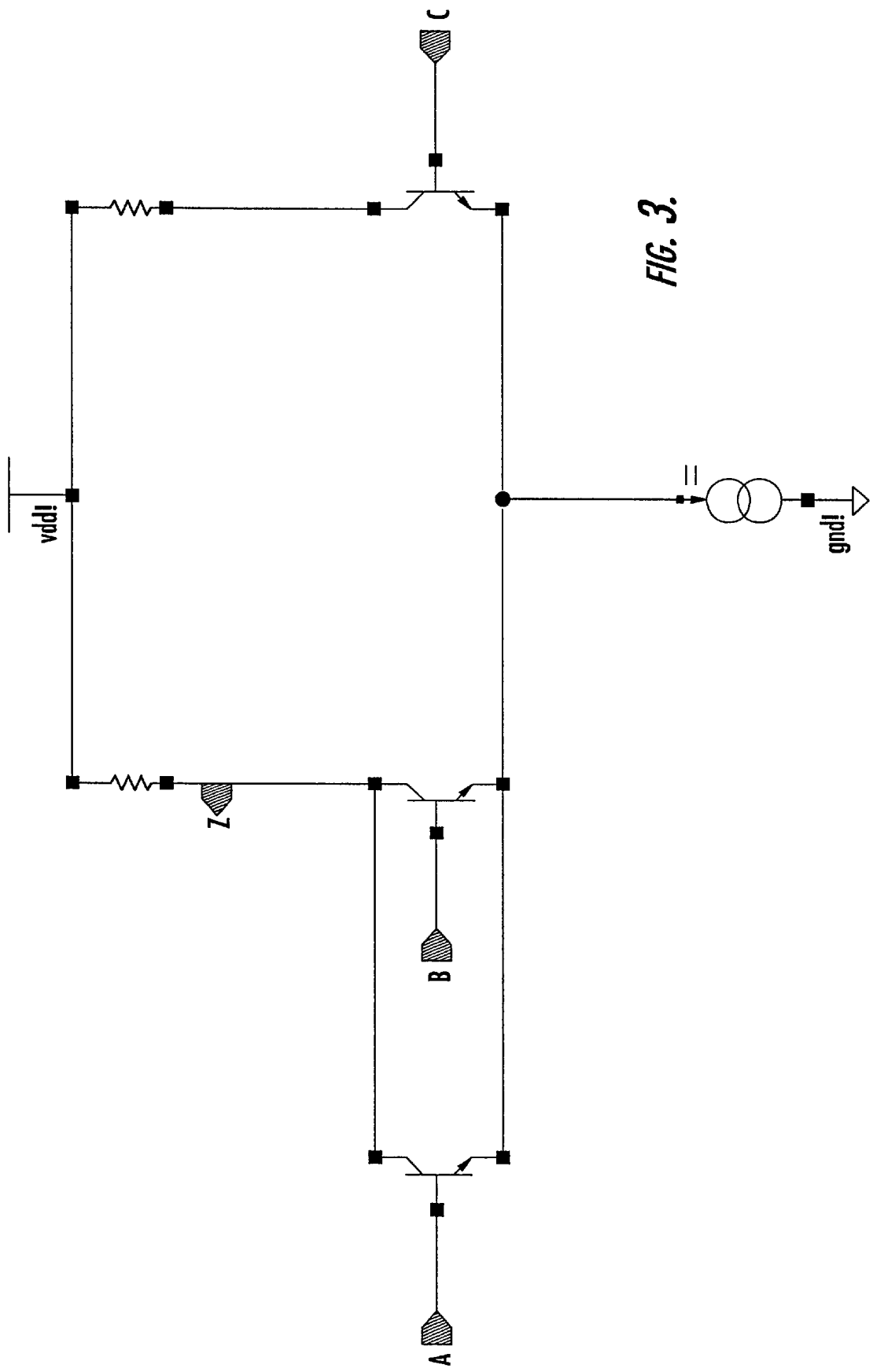
FIG. 3 is an example of a three-input NOR circuit usable in a flash ADC of the invention.

FIG. 3 shows a suitable circuit for each three-input logic NOR gate, usable in the flash analog-to-digital converter of the present invention.

What is claimed is:

1. An analog-to-digital flash converter comprising:
   a bank of comparators with a differential output for generating a thermometric code;
   a bank of three-input logic NOR gates connected to the bank of comparators; and
   a passive interface comprising a plurality of voltage dividers, each connected between a noninverted output of a respective comparator and an inverted output of a comparator of higher order in the bank of comparators;
   each corresponding three-input logic NOR gate of the bank of three-input logic NOR gates has a first input coupled to the inverted output of the respective comparator, a second input coupled to the noninverted output of the comparator of higher order, and a third input coupled to an intermediate node of a corresponding voltage divider of the plurality of voltage dividers.

2. A converter according to claim 1, wherein the converter comprises a BiCMOS converter.

3. A converter according to claim 1, further comprising a PLA decoder, including a NOR circuit having inputs coupled to outputs of the bank of three-input logic NOR gates, and for generating an output of N bits corresponding to the thermometric code.

4. An analog-to-digital converter comprising:
   a plurality of comparators with a differential output for generating a thermometric code;
   a plurality of NOR gates connected to the plurality of comparators; and
   an interface between the plurality of comparators and the plurality of NOR gates, the interface comprising a plurality of voltage dividers, each connected between a noninverted output of a respective comparator and an inverted output of a comparator of higher order of the plurality of comparators;
   each NOR gate of the plurality of NOR gates has a first input connected to the inverted output of the respective comparator, a second input connected to the noninverted output of the comparator of higher order, and a third input connected to an intermediate node of a corresponding voltage divider of the plurality of voltage dividers.

5. A converter according to claim 4, wherein the converter comprises a BiCMOS converter.

6. A converter according to claim 4, further comprising a decoder including a NOR circuit having inputs coupled to outputs of the plurality of NOR gates, and for generating an output of N bits corresponding to the thermometric code.

7. An analog-to-digital converter comprising:
   at least first and second comparators each of which includes a noninverted output and an inverted output;
   at least one voltage divider connected between the noninverted output of the first comparator and an inverted output of the second comparator; and
   at least one logic gate having a first input connected to the inverted output of the first comparator, a second input connected to the noninverted output of the second comparator, and a third input connected to the voltage divider.

8. A converter according to claim 7, further comprising a decoder connected to an output of the logic gate.

9. A converter according to claim 8, wherein the decoder generates an output of N bits corresponding to a thermometric code.

10. A converter according to claim 9, wherein the at least one logic gate comprises a logic NOR gate.

11. A method for analog-to-digital conversion comprising the steps of:
   providing at least first and second comparators each of which includes a noninverted output and an inverted output;
   voltage dividing the noninverted output of the first comparator and an inverted output of the second comparator; and
   logically combining the inverted output of the first comparator, the noninverted output of the second comparator, and the voltage divided noninverted output of the first comparator and inverted output of the second comparator.

12. A method according to claim 11, further comprising the step of decoding the logical combination of the inverted output of the first comparator, the noninverted output of the second comparator, and the voltage divided noninverted output of the first comparator and inverted output of the second comparator.

13. A method according to claim 12, further comprising the step of generating an output of N bits corresponding to a thermometric code.

14. A method for analog-to-digital conversion comprising the steps of:

providing at least first and second comparators each of which includes a noninverted output and an inverted output;

providing at least one voltage divider connected between the noninverted output of the first comparator and an inverted output of the second comparator; and providing at least one logic gate having a first input connected to the inverted output of the first comparator, a second input connected to the noninverted output of the second comparator, and a third input connected to the voltage divider.

15. A method according to claim 14, further comprising the step of providing a decoder connected to an output of the logic gate.

16. A method according to claim 15, wherein the decoder generates an output of N bits corresponding to a thermometric code.

17. A method according to claim 14, wherein the at least one logic gate comprises a logic NOR gate.

* * * * *

UNITED STATES PATENT AND TRADEMARK OFFICE
CERTIFICATE OF CORRECTION

PATENT NO. : 6,346,905 B1
DATED : February 12, 2002
INVENTOR(S) : Daniele Ottini, Melchiorre Bruccoleri, Giacomino Bollati and Marco Demicheli It is certified that error appears in the above-identified patent and that said Letters Patent is hereby corrected as shown below:

<u>Column 4,</u>
Delete "9" insert -- 7 --

Signed and Sealed this

Ninth Day of July, 2002

Attest:

JAMES E. ROGAN
Attesting Officer  Director of the United States Patent and Trademark Office

UNITED STATES PATENT AND TRADEMARK OFFICE
CERTIFICATE OF CORRECTION

PATENT NO.    : 6,346,905 B1
DATED         : February 12, 2002
INVENTOR(S)   : Daniele Ottini, Melchiorre Bruccoleri, Giacomino Bollati and Marco Demicheli It is certified that error appears in the above-identified patent and that said Letters Patent is hereby corrected as shown below:

<u>Column 4,</u>
Line 42, delete "9" insert -- 7 --

This certificate supersedes Certificate of Correction issued July 9, 2002.

Signed and Sealed this

Twenty-seventh Day of August, 2002

Attest:

Attesting Officer

JAMES E. ROGAN
*Director of the United States Patent and Trademark Office*